United States Patent [19]

Petit et al.

[11] Patent Number: 4,630,270
[45] Date of Patent: Dec. 16, 1986

[54] METHOD FOR IDENTIFYING A FAULTY CELL IN A CHAIN OF CELLS FORMING A SHIFT REGISTER

[75] Inventors: Dominique A. Petit, Corbeil-Essonnes; Marc P. Du Pasquier, Evry, both of France

[73] Assignee: International Business Machines Corporation, Armonk, N.Y.

[21] Appl. No.: 671,832

[22] Filed: Nov. 15, 1984

[30] Foreign Application Priority Data

Dec. 28, 1983 [EP] European Pat. Off. .......... 834300436

[51] Int. Cl.$^4$ ............................................. G01R 31/28
[52] U.S. Cl. .................................. 371/29; 324/73 R; 364/483; 371/25
[58] Field of Search ............................ 371/25, 29, 21; 364/487, 481, 483; 324/73 R, 73 AT; 179/175.3 F

[56] References Cited

U.S. PATENT DOCUMENTS

| 3,573,751 | 4/1971 | DeLisle | 371/25 X |
|---|---|---|---|
| 3,761,695 | 9/1973 | Eichelberger | 371/25 |
| 3,783,254 | 1/1974 | Eichelberger | 235/152 |
| 3,784,907 | 1/1974 | Eichelberger | 324/57 DE |
| 3,961,252 | 6/1976 | Eichelberger | 324/73 AT |
| 4,006,320 | 2/1977 | Markl | 179/175.31 R |
| 4,209,666 | 6/1980 | Lawton | 179/175.3 F |
| 4,495,642 | 1/1985 | Zellmer | 364/487 X |
| 4,500,834 | 2/1985 | Ko et al. | 179/175.3 F |

OTHER PUBLICATIONS

Nicholson, Extending Signature Analysis, Electronics Industry, Mar. 1981, pp. 12, 13, 15, 16.
Berglund, "Level-Sensitive Scan Design Test Chips, Boards, System," Electronics, Mar. 15, 1979, pp. 108–110.
Williams et al., "Design for Testability-A Survey," IEEE Transactions on Computers, vol. C-31, No. 1, Jan. 1982, pp. 2–15.

Primary Examiner—Charles E. Atkinson
Attorney, Agent, or Firm—Douglas A. Lashmit

[57] ABSTRACT

A method for identifying the rank of a faulty cell in a chain of cells forming a shift register in a functional element, each cell including a pair of latches acting as master-slave elements having data inputs, clock inputs, and data outputs, each cell being associated with a combinatorial logic block. In one embodiment the location or rank of the faulty cell is determined by placing the faulty functional element in a static mode, applying a square pulse to its data input, observing the output waveform representing variations of input current that occur during propagation of the pulse along the chain, and detecting the absence of these variations, the absence indicating a defective cell just loaded with a data bit. The rank of the faulty cell is determined in one embodiment by comparing the output waveform with that of a known satisfactory functional element, either manually or automatically.

5 Claims, 6 Drawing Figures

METHOD FOR IDENTIFYING A FAULTY CELL IN A CHAIN OF CELLS FORMING A SHIFT REGISTER

BACKGROUND OF THE INVENTION

This invention relates to techniques used for testing integrated circuits and, more particularly, to a method for identifying a faulty cell in a chain of cells forming a shift register in a functional element, each cell being formed of a linked pair of latches.

As is well known, the principal obstacle to testing integrated circuits, particularly large-scale integrated (LSI) circuits, in a given functional element (chip, module, board or system) is the inaccessibility of internal signals, especially the nodes of the network. Prior test techniques involve complex sequential patterns intended to exercise all the internal circuits and transfer the results to the output pins of the functional element for observation.

With today's highly complex functional elements, however, these test techniques have become unsatisfactory because they take too much time, are too costly, and are generally inefficient.

One solution to this problem is embodied in a test technique based upon an approach called "Level-Sensitive Scan Design" (LSSD), as described in U.S. Pat. Nos. 3,783,254, 3,784,907 and 3,961,252, assigned to the assignee of the present invention. The LSSD technique enables testing problems to be solved at all levels of packaging. This technique permits every functional element to be completely tested and even allows a complex system to be diagnosed at the customer's site by a field-service engineer. As used herein, the term "functional element" essentially means a chip or a module, but could also apply to a board or a system.

The principles of the LSSD technique as used to test integrated circuits are described in an article by Neil C. Berglund entitled "Level-Sensitive Scan Design Tests Chips, Boards, Systems" published in Electronics, Mar. 15, 1979, pp. 108-110. This article is incorporated herein by reference.

The lowest level of packaging is the chip. As is well known, this is a silicon slice containing several thousands of elementary components, such as transistors, diodes and resistors, interconnected to form hundreds of circuits capable of performing desired logic functions. Several chips are assembled onto a ceramic substrate provided with input/output pins for establishing electrical connections with the outside world. The substrate is encapsulated into a module. Several modules are in turn mounted into a printed circuit board. Lastly, at the highest level of packaging, several boards may be interconnected to form a system.

With LSSD, a chip may comprise several combinatorial logic blocks each of which is associated with a storage cell consisting of a latch called a Shift Register Latch (SRL). A single long shift register termed an "LSSD chain" is formed by chaining a number of such cells or SRLs together. Each SRL, which is actually a pair of bistable latches designated L1, L2, forms a single stage of the shift register.

The L1 latch can be set from two sources by two different clock signals, A and C, applied to clock inputs A and C, with the latter input receiving system clock signals. Latch L1 also has a data input, Data In (DI), and a test input called Scan Data In (SDI). Test patterns consisting of binary words are applied to the SDI pin of the chip. Latch L2 has a data input connected to one of the outputs of the associated L1 latch, and an input that receives B clock signals causing the output data from L1 to be transferred into L2.

The long shift register referred to above is formed by connecting the output of the L2 latch in the first SRL (forming the first stage of the register) to the input of the L1 latch in the next SRL, and so on, down to the last SRL. The test input, SDI, of the L1 latch in the first SRL is connected to the SDI pin, or main input, of the chip, and the output of the L2 latch in the last SRL is connected to an output pin, designated Scan Data Out (SDO), or main output, of the chip. The A, B and C clock inputs of each SRL are connected to chip input pins so designated. Obviously, the "chain" concept is also applicable to functional elements of the same type or different types.

It should be noted that while the latches forming the LSSD chains may represent as much as 40% of the surface area of a logic chip, most of these are used to implement the normal system function.

Bits are transferred through the SRL in two steps. A bit applied to the test input, SDI, of latch L1 is loaded therein by the A clock pulse, and the same bit is obtained at the output of the L2 latch at the occurrence of the B clock pulse. A number of pairs of A and B clock pulses equivalent to the number of SRLs is required in order for a signal applied to the SDI input of a functional element to be transferred to the SDO output thereof. In this mode of operation, system clock C is not pulsed.

To test a functional element, a static test called a "flush" test is first performed. To this end, an active potential, for example a high logic level, is applied to the A and B clock inputs ($A=B=1$), while the C clock input receives a low logic level ($C=0$). A square pulse is applied to the SDI input of the chain to be tested and is retrieved at the SDO output after a predetermined time interval has elapsed. This is a combinatorial type of static test in which every latch in the LSSD chain acts as an inverter so that the chain operates as a series of inverters rather than as a shift register. As a result, the data pulse applied to input SDI is obtained at output SDO of the chain after a time interval equal to the accumulated response times of all the SRLs in the chain has elapsed. In addition to providing useful information on the propagation times, the flush test determines whether the LSSD chain is functioning properly.

A dynamic test called a "scan" test is next performed, in which the C clock input is maintained at a low logic level while pulsing the A and B clocks (which are not simultaneously activated). The LSSD chain then acts as a shift register. This test serves to establish that the chain is not operating properly if the data pulse applied to the SDI input fails to be transferred to the SDO output when clock pulses are applied to the A and B clock inputs Lastly, a functional test is performed in the scan mode. Briefly, a test pattern (a series of binary data) is applied to the SDI input and the A and B clocks are pulsed to transfer the test pattern into the SRLs. All the latches in the functional element having thus been initialized, logic data are present on the parallel output pins of the element. By applying stimuli to the parallel input pins of the element and by pulsing the C clock, a binary word reflecting some particular state of the combinatorial logic is loaded in the LSSD chain. The output pins can then be observed to determine if the combinatorial logic is functioning properly and the results are compared with the expected state of the SRLs, as determined by a computer simulation model (see FIG. 2 of the article referred to earlier). In this manner, the logic on the functional element is tested for typically 98% to 100% of all DC faults with program-generated test data.

In actual practice, the flush test is preceded by a parametric test that consists of determining such analog values as current consumption, leakage currents, and the like.

The object of the flush and scan tests is to determine if the LSSD chains are functioning properly. If such is the case, and if no short circuits or open circuits exist in the connections between the latches or in the clock pulse distribution circuits, then a functional test of the combinatorial logic itself is performed.

Since the LSSD chains, as described above, may represent up to 40% of the chip's surface area, and since a typical chain may comprise anywhere from 20 to 250 cells or SRLs, the probability of at least one failure occurring in a chain is far from negligible. Further, because the SRLs usually are scattered on the chip's surface, it is extremely difficult to quickly identify a faulty SRL, either during manufacturing or in field service, and to take remedial action. Thus, known tests of the flush or scan type can only provide information of a general nature, such as whether the LSSD chain is functioning properly or improperly. In the latter case, there was heretofore no way of identifying the faulty cell(s) in the chain, thus, the entire functional element had to be discarded.

Accordingly, there is a need for a test technique more refined than either the flush test or the scan test to permit faulty cells to be precisely identified so that remedial action can be taken during circuit fabrication. For example, if chips from different wafers should all be found to have the same faulty cell, this could probably be ascribed to some defect in the lithographic mask used to fabricate these wafers. In addition, the desired test technique should allow faulty cells to be identified regardless of the type of functional element (chip, module, etc.) involved. Lastly, the test technique should be simple, accurate and relatively inexpensive.

SUMMARY OF THE INVENTION

It is therefore an object of this invention to eliminate the shortcomings of the prior art techniques by providing an electrical diagnostic method of identifying a faulty cell in a shift register comprised of latches having at least two clock inputs, or which are capable of being operated in the above described flush mode.

This and other objects are achieved by providing an electrical diagnostic method for identifying the rank P of a faulty cell in a chain of N cells forming a shift register or LSSD chain. Each cell consists of a latch which is actually a linked pair of latches L1, L2 acting as a master-slave storage element. Master latch L1 has data inputs DI, SDI, and clock inputs A, C, while slave latch L2 has a single clock input, B. The chain is associated with combinatorial logic blocks in accordance with the LSSD technique and is integrated into a given functional element. In the present invention, variations in the current $I_{dd}$ supplied to the functional element when placed in a static mode of operation are analyzed. This method includes the steps of:

a. placing the functional element in a static mode of operation and applying a square pulse representing a data bit to its SDI input;

b. observing the waveform representing variations of the current $I_{dd}$ supplied to the functional element that occur during propagation of the square pulse down the chain to the SDO output thereof, the waveform being called the "signature";

c. detecting any absence of such variations ($I_{dd}$=constant), which would indicate a faulty condition of the cell just loaded with the data bit; and d. determining the rank P of the faulty cell in the chain.

In a preferred embodiment, a faulty cell can be detected by comparing the signature with a signature obtained for a reference functional element previously tested and determined to be functioning properly.

In another preferred embodiment, a faulty cell is detected by a test configuration in which the rank P of the cell is displayed on the screen of a display device.

The foregoing and other objects, features and advantages of the invention will be more readily apparent from the following description thereof, as illustrated in the accompanying drawings.

DETAILED DESCRIPTION OF THE INVENTION

In accordance with the method of the present invention, each LSSD chain in a functional element to be tested is placed in the flush mode, that is, clock inputs A, B and C are at the respective logic levels 1, 1 and 0, while a square pulse representing a data bit is applied to input SDI. This pulse will reach output SDO after a time interval equal to the sum of the propagation times for the N cells comprising the chain. The propagation of this pulse causes changes in state to occur in the successive cells and also within the associated blocks of combinatorial logic (logic gates, logic arrays, PLA, etc.).

Figure 1:
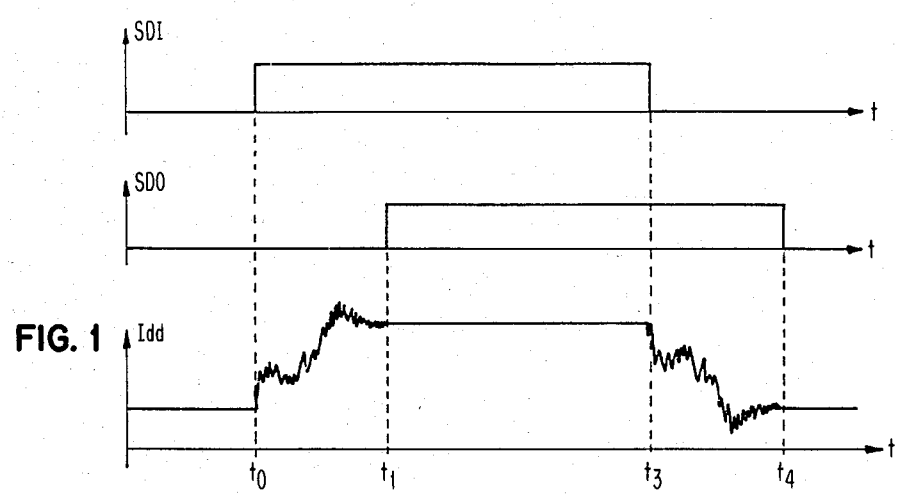
FIG. 1 is a timing diagram showing the variations of the current $I_{dd}$ supplied to a functional element in the flush mode when a square pulse is applied to the SDI input thereof.

It has been found that, when the current $I_{dd}$ supplied to the functional element is displayed as a function of time, e.g., on the screen of an oscilloscope, rapid variations of the trace can be observed until the leading edge of the pulse applied to the SDI input (at time $t_0$) reaches the SDO output (at time $t_1$, that is, during a time interval $\Delta t = t_1 - t_0$. This is shown in FIG. 1, which is a timing diagram of the various pulses and shows in particular the waveform representing the variations of current $I_{dd}$. This waveform will be referred to hereinafter as the "signature". Note that, as shown in FIG. 1, the signature obtained between times $t_3$ (down-going transition of the pulse applied to SDI) and $t_4$ (when the trailing edge of the pulse reaches output SDO), that is, during the same time interval $\Delta t$ as above, is the inverse of the signature obtained between $t_0$ and $t_1$.

It was found that the amplitude of the peaks observed on the screen of the oscilloscope is essentially dependent upon the different types of latches used in a chain, and the capacitive load of its output. These peaks are caused by the changes of logic stage that occur in the successive cells of the chain.

Figure 2:
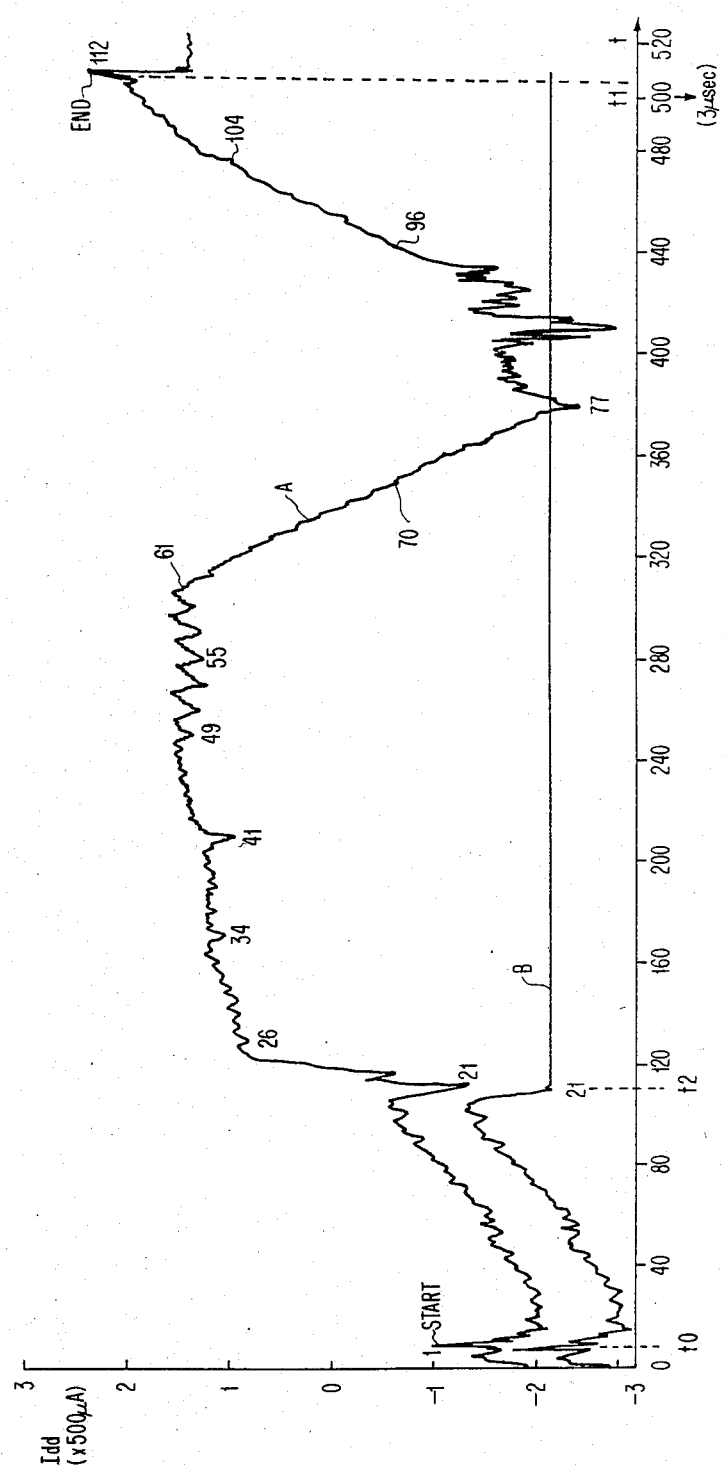
FIG. 2 is a timing diagram showing the variations of current $I_{dd}$ supplied to a pair of identical functional elements, wherein the LSSD chain of one is functioning properly and the LSSD chain of the other includes a faulty cell.

In any chain, when the leading edge of the data pulse reaches a faulty cell, the pulse does not propagate beyond that cell and the signature becomes linear, with current $I_{dd}$ remaining constant and equal to the value it had reached immediately before being fed to said cell. FIG. 2 shows two waveforms or signatures, A and B, representing the variations of current $I_{dd}$ that occur when the same chain of cells in two identical functional elements are subjected to a flush test. The fact that signature A contains no linear portion indicates that the input pulse reached the output of the chain and that therefore, the chain functioned properly. As explained below, signature A can be used as a reference for test purposes. The initial peak at time $t_0$, and the final one at time $t_1$, respectively indicate the first and the last changes of logic state. The reference numerals (21, 26, 34, etc.) appearing on both waveforms denote specific cells whose positions, as will be explained, are used as references to make it easier to locate faulty cells. As shown, signature B becomes linear after the pulse was applied to the cell of rank 21 at time $t_2$, thereby indicating a faulty condition of this cell.

Figure 3:
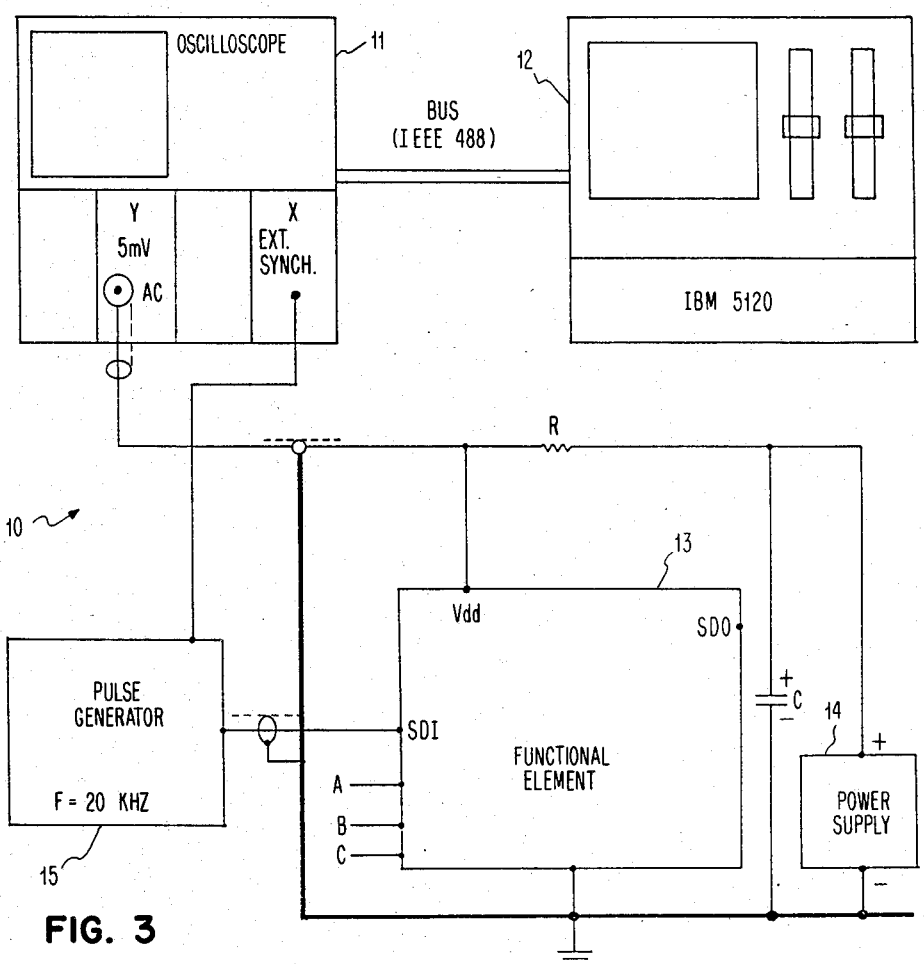
FIG. 3 is a diagrammatic block diagram of a test configuration for manually determining the rank P of a faulty cell in accordance with a first embodiment of the present invention.

As shown in FIG. 3, the test configuration used in this embodiment is straightforward. This arrangement includes a digital storage oscilloscope 11 such as a Textronix Model 7854 provided with an IEEE 488 bus interface. The oscilloscope is connected to a data processing system 12, for example, an IBM 5120 computer including diskette storage means to facilitate the subsequent display of the reference waveforms for the various types of functional elements to be tested. The functional element, which may be, for example, a module 13 provided with input and output pins is mounted onto a suitable support and supplied with current by a power supply 14 through a series-connected resistor R having a value of a few ohms coupled to input pin $V_{dd}$. A capacitor, having a value on the order of 100 $\mu$F, is connected in parallel with the power supply to reduce the noise generated by the test apparatus. The module's A, B, and C clock input pins are suitably biased to permit operation in the flush mode. All LSSD chains in the module are successively tested. The SDI pin is connected to a square pulse generator 15 that operates at a frequency of about 20 KHz and also synchronizes the oscilloscope. Pin $V_{dd}$ is also connected to a terminal of the Y-amplifier of the oscilloscope by means of a coaxial cable which should be as short as possible to avoid the attenuation of the peaks of current. Generally, shielded cables should be used for all connections, and ground connections should be as wide as possible. The output pins of the module should either be floating, if they correspond to open drain regions of FETs, or exhibit a high impedance, if they correspond to tri-state logic circuits, to prevent the switching noise created by the drivers from affecting the signature. To test a given chain of cells, the signature obtained for that chain and the corresponding reference signature may be simultaneously displayed on the screen of the oscilloscope and compared as shown in FIG. 2.

The rank P of a faulty cell can readily be determined by counting the number of peaks of current $I_{dd}$ that occurred during the time interval $t_2 - t_0$. To this end, the reference signature is first analyzed to determine those cells which, because of their type or function in the chain, for example, cells having a high capacitive load or cells which, in addition to peaks of current, cause a conspicuous change in the value of current $I_{dd}$, produce characteristic waveforms with respect to which the location of a faulty cell can more readily be determined.

The rank P of a faulty cell can also be determined by means of the following expression:

$$P = [N \times (t_2 - t_0)] / [t_1 - t_0]$$

where N is the total number of cells in the chain, $t_1 - t_0$ is the time taken by a data pulse to propagate to the output of the chain, and $t_2$ is the time at which the faulty cell is detected, as determined by oscilloscope 11.

In practice, the location of the faulty cell is determined to within one or two cells, due to the fact that the delays introduced by the various cells comprising the chain are not absolutely identical as they depend on the characteristics of the cells, the wiring of the inputs, the loads, etc. However, these delays can be accurately determined and a computer program can be used to obtain an accurate determination of the rank P.

Lastly, the method of the present invention can immediately provide under certain conditions, particularly if the functional element being tested is a chip, precise information on the nature of the fault, particularly if a short circuit between two conductors or an open circuit in a conductor is involved. These two types of faults account for most of the failures experienced.

With an LSSD chain of pairs of conventional FET latches acting as master-slave elements, it has been found that, if the fault is an open circuit between any two latches, the signature becomes linear at the location of the faulty cell. However, in the case of a short circuit between a conductor used in the LSSD chain and another conductor, a peak of current occurs before the signature becomes linear, because the conductor in the LSSD chain is connected to a conductor whose potential toggles between the 0 and 1 logic levels so that a conflict occurs before or after the leading edge of the data pulse, causing the current to suddenly decrease or increase at that time. Lastly, when a fault (open circuit or short circuit) occurs in the conductor over which the clock signals are sent, the latch concerned reacts in the same manner as if an open circuit had occurred and the signature becomes linear.

Once the faulty cell and the type of fault have been identified, the fault can readily be observed, using, for example, a microscope in the case of a short circuit, or an electron microscope to examine the entire LSSD chain and the path of the clock signals in the case of an open circuit.

In another embodiment, shown in FIG. 5, the test apparatus is similar to that previously described in relation to the first embodiment, except that pulse generator 15 is replaced by a more complex pulse generator associated with an automatic display device, as explained below.

Figure 4:
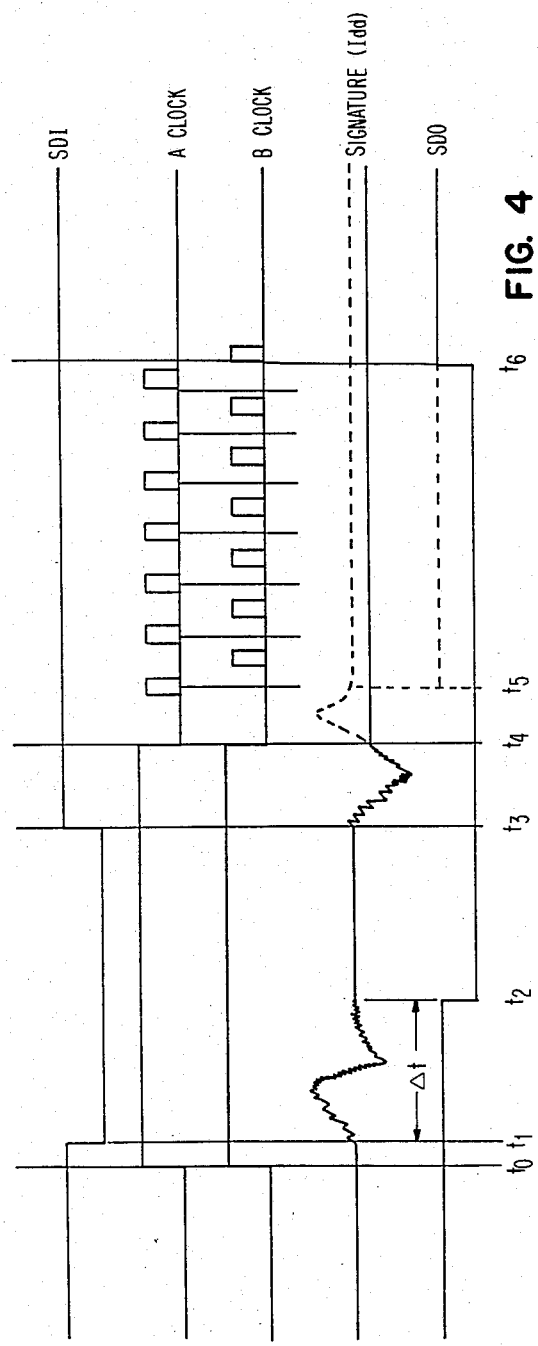
FIG. 4 is a timing diagram of the pulses applied to the input and the resulting signature of a functional element containing no faulty cells, in accordance with a second embodiment of the present invention.

A flush test is performed as before to determine whether a given chain of cells in a module 13 functions properly. If such is not the case, the signature obtained for the faulty chain is stored in oscilloscope 11. The faulty module 13 is removed and replaced by an identical module 13' that was previously tested and found to be satisfactory. The stored signature, which remains displayed on the screen of the oscilloscope, is then compared with the signature obtained for a corresponding chain of cells in module 13'. To this end, module 13' is placed in the flush mode. Beginning at time $t'_0$, clocks A and B supply a continuous high level, as shown in FIG. 4, then, at time $t'_1$, a square pulse is applied to the SDI input of the corresponding chain. At time $t'_2$, after a time interval $\Delta t'$ has elapsed, the leading edge (downgoing transition) of the square pulse reaches the SDO output. The figure shows that the characteristic waveform of a functional chain is obtained between time $t'_1$ and $t'_2$ on the output terminal where current $I_{dd}$ is measured. Upon completion of this process, all cells are at the 0 logic level.

Time $t'_3$ corresponds to the end of the square pulse applied to input SDI. If module 13' remained in the flush mode after $t'_3$, the signature would be the inverse of the one obtained during time interval $\Delta t' = t'_2 - t'_1$, as shown in FIG. 1, and would end at time $t'_5$ corresponding to the normal change of logic level of the pulse on the SDO output, which would go to a 1 level after an identical time interval $t' = t'_5 - t'_3$. The oscilloscope is calibrated to cause this signature to be superimposed on the screen on that obtained for the faulty chain of cells.

The width of the A and B clock pulses is then modified so that the "good" or reference module remains in the flush mode only long enough to permit the display of that portion of its signature which is identical to that of the faulty module. As shown in FIG. 4, the reference module only remains in the flush mode between times $t'_3$ and $t'_4$, that is, until the data pulse reaches the cell having the same rank P as the faulty cell. Consequently, the time interval $T = t'_4 - t'_3$ must be variable to accommodate chains of different lengths ($1 \leq P \leq N$).

The scan mode is then entered at time $t'_4$ by inhibiting clocks A and B, thereby causing the propagation of the data pulse in the chain of cells of the reference module to be interrupted at a point that exactly corresponds to the location of the faulty cell in the faulty module.

The A and B clocks are then pulsed to cause the propagation of the data pulse to resume, and the number of pairs of A and B clock pulses required to enable the data pulse to reach output SDO and change state indicates the number (N-P) of stages that separate the faulty cell from the end of the chain, as shown in FIG. 4. As described above, the reference module remains in the flush mode until $t'_4$. Between times $t'_3$ and $t'_4$, the two signatures superimposed on the screen will be identical. If the flush mode had been maintained beyond $t'_4$, then the signature indicated by the dashed line would have been obtained, and the anticipated change of level of the pulse on output SDO (also shown as a dashed line) would have occurred at $t'_5$. However, since the scan mode was entered at $t'_4$, the signature shown as a solid line in FIG. 4 is obtained. As shown, seven pairs of A and B clock pulses are required after time $t'_4$ to bring up the data pulse to the 1 level on output SDO. At this time, 1's are written into all cells of the chain of the reference module. Therefore, the faulty cell is the seventh cell, counting backwards from the end of the chain. The voltage and current levels illustrated in FIG. 4 are those used in standard TTL logic circuits.

It should be noted that the test arrangement could be different from what has been shown and described above. For example, a microprocessor could be used to control the sequences of clock pulses shown in FIG. 4.

Figure 5:
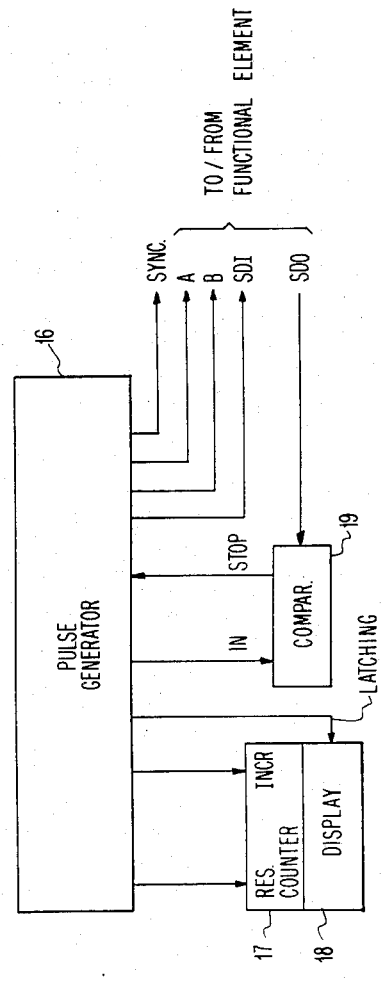
FIG. 5 is a block diagram of a test configuration for determining the rank P of a faulty cell, in accordance with the embodiment of FIG. 4.

Referring now to FIG. 5, a block diagram of a test configuration in accordance with the second embodiment is shown. This arrangement includes a pulse generator 16 which supplies the Sync signal needed to synchronize oscilloscope 11, the A and B clock pulses (system clock C is not pulsed in either the flush or the scan mode) kand the square pulse to be applied to the SDI input during the test. A counter 17 counts the pairs of clock pulses from the time the scan mode is entered until the time the change of logic level of the pulse on output SDO occurs, and the count thus obtained is displayed on device 18. A comparator 19 detects the change of logic level on SDO and sends a Stop signal to the pulse generator. Upon receipt of this signal, generator 16 inhibits the counting operation.

Figure 6:
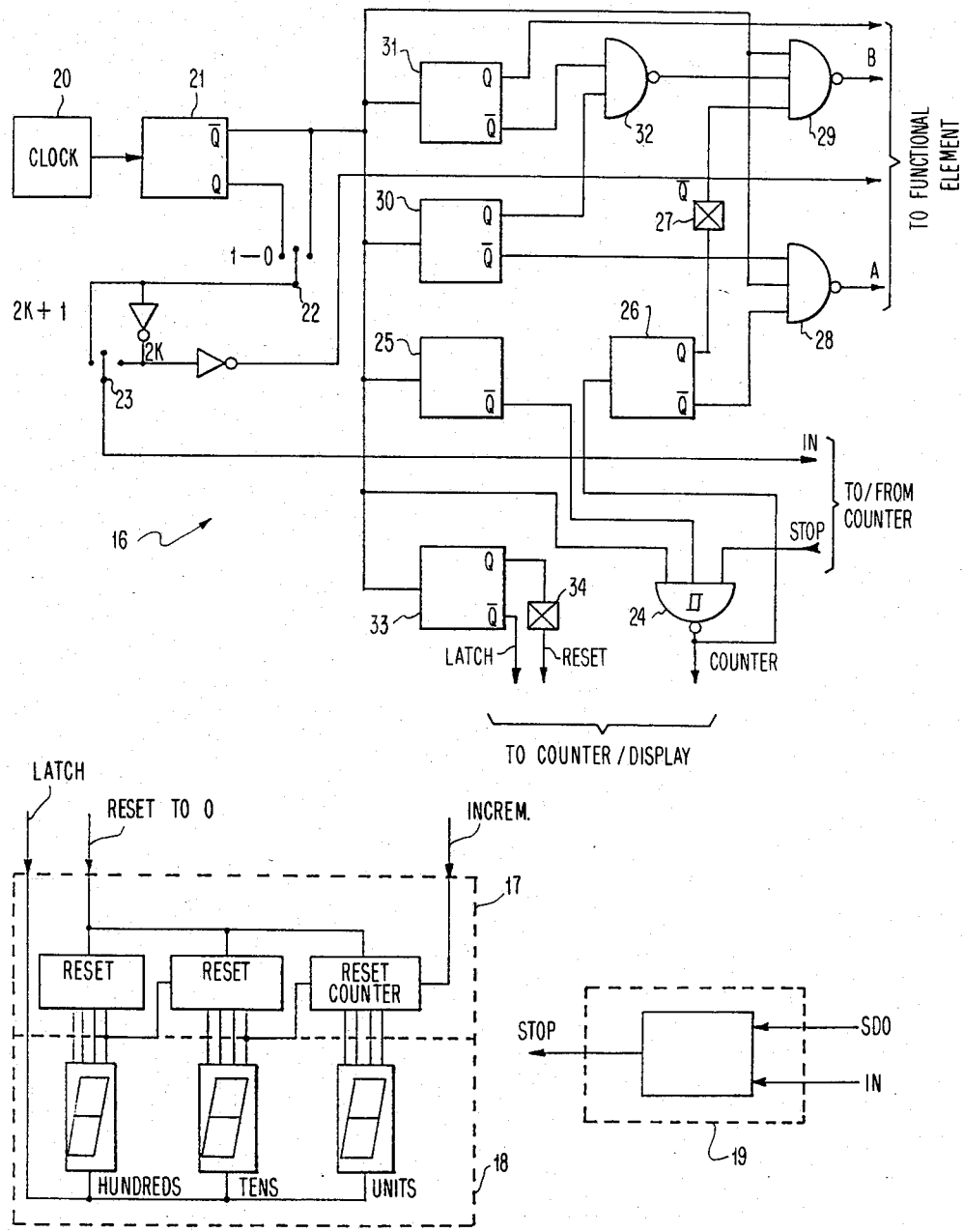
FIG. 6 shows in greater detail the test configuration of FIG. 5.

The test configuration is shown in greater detail in FIG. 6. A master clock 20 generating pulses at a frequency of 4 KHz controls the entire test arrangement and drives a one-shot device 21 (8 μsec) whose Q and $\overline{Q}$ outputs can be selected by a switch 22. This switch also selects the logic level of the signal applied to the SDI input. Another switch 23 is used for either inverting or not inverting the signal depending on whether the number of cells in the chain is even or odd. The IN signal (corresponding to the input signal applied to SDI or to the inverse thereof) available on the common contact of switch 23 is applied to a first input of a comparator 19 (an XOR circuit) the second input of which receives the signal obtained on output SDO. Comparator 19 supplies the Stop signal and compares the signals on SDI and SDO to detect the change in logic level of the signal on SDO. A 2 MHz clock 24 (a Schmitt trigger) receives the clock pulses from clock 20, either directly or through a one-shot 25, as well as the Stop signal. Clock 24 controls one-shots 26 and 27 whose outputs are applied to NAND gwtes 28 and 29 for providing the A and B clock pulses. Clock 24 also drives counter 17. A given time delay exists beween the A and B clock pulses, both of which have predetermined widths, particularly during the scan mode (after time $t'_4$). The duration of the flush mode, between times $t'_3$ and $t'_4$, is controlled by adjusting a variable resistor associated with a one-shot 30. This enables the operator to cause the signature obtained for the chain of cells in the reference module to end at the exact location of the faulty cell, so that only those portions of the reference signature and of the faulty module's signature which are identical will be superimposed on the screen of the oscilloscope. The change from the flush mode to the scan mode and vice-versa is automatic, after a predetermined delay introduced by one-shot 25 has elapsed. One-shot 31 generates the pulse required to synchronize the oscilliscope. An optional gate 32 introduces a delay as necessary to compensate for jitter. The signal on output $\overline{Q}$ of one-shot 33 latches the internal circuits of display device 18 and the signal on output Q drives a one-shot 34 whose output signal resets counter 17 to zero.

While the invention has been shown and described with reference to preferred embodiments thereof, it will be understood by those skilled in the art that various changes in form and details may be made therein without departing from the spirit and scope of the invention.

What is claimed is:

1. A method of identifying the rank of a faulty cell in a chain of cells forming a shift register in a functional element, each cell comprising a pair of latches having data inputs, data outputs, and clock inputs, each cell being associated with a combinatorial logic block, comprising the steps of:

placing said faulty functional element in a static mode of operation and applying a square pulse representing a data bit to a data input;

observing the resulting output waveform representing variations of current supplied to said functional element that occur during propagation of the square pulse along the chain until it reaches the output thereof; and detecting any absence of said variations, said absence indicating a faulty condition of the cell just loaded with said data bit, wherein the relative time of occurrence of said absence of variations is related to the rank of said faulty cell in said chain of cells.

2. The method of claim 1, wherein said observing step comprises storing said output waveform in digital storage means.

3. The method of claim 2, further including the step of counting the number of peaks of current that occurred until said output waveform became linear to determine the rank of said faulty cell in said chain of cells.

4. The method of claim 2, wherein the rank P of said faulty cell in said chain of N cells is determined by the expression $$P = [N \times (t_2 - t_0)] / [t_1 - t_0]$$

where $t_1 - t_0$ is the time interval that is required for a data bit to propagate to the output of said chain of N cells, and $t_2 - t_0$ is the time interval during which the variation of current is not zero.

5. The method of claim 2, wherein said detecting step comprises the steps of:

placing a second functional element previously determined to be satisfactory in a static mode and applying a square pulse representing a data bit to its data input;

observing the output waveform of said second functional element, representing variations of current supplied to said second functional element that occur during propagation of said square pulse along a second chain of cells, and superimposing on said second output waveform said first output waveform for said faulty functional element;

reducing the duration of said static mode so that said second output waveform ends at the point in time where said first output waveform became linear; and placing said second functional element in a scan mode and counting the number of pairs of clock pulses required to obtain a change in logic state of the signal on the output of said second functional element, wherein said number of pairs of clock pulses is equal to the difference between the number of cells in said chain of cells in said first functional element and the rank of said faulty cell.

* * * * *